United States Patent
Snowden et al.

[11] Patent Number: 5,825,706
[45] Date of Patent: Oct. 20, 1998

[54] CIRCUIT AND METHOD FOR RETAINING DATA IN DRAM IN A PORTABLE ELECTRONIC DEVICE

[75] Inventors: Ralph Snowden, Lakeway; Wendy Reed, Sutin; Glen James Zoerner, Austin, all of Tex.; Wai-Kin Steven Kwan, Kowloon, Hong Kong; On Ki Andrew Chu, Hong Kong, Hong Kong; Hing Leung Yiu, Hong Kong, Hong Kong

[73] Assignee: Motorola, Inc., Schaumburg, Ill.

[21] Appl. No.: 958,645

[22] Filed: Oct. 27, 1997

[51] Int. Cl.[6] .................................................. G11C 7/00
[52] U.S. Cl. ........................... 365/222; 365/233; 395/427
[58] Field of Search .................................... 365/222, 233; 395/427, 405

[56] References Cited

U.S. PATENT DOCUMENTS

| | | |
|---|---|---|
| 5,321,661 | 6/1994 | Iwakiri et al. ............................ 365/222 |
| 5,402,384 | 3/1995 | Fujisawa .................................. 365/222 |
| 5,453,959 | 9/1995 | Sakuta et al. ............................ 365/222 |
| 5,477,491 | 12/1995 | Shirai ..................................... 365/222 |
| 5,537,564 | 7/1996 | Hazanchuk .............................. 365/222 |

*Primary Examiner*—Son T. Dinh
*Attorney, Agent, or Firm*—Daniel D. Hill

[57] ABSTRACT

When an external reset signal EXRST is asserted received by a reset unit (6), it is synchronised with an internal clock to produce an internal reset signal INRST, which is applied to a CPU (4) and other modules in the circuit to reset them. While the internal reset signal INRST is being applied to the CPU, the rate of a refresh signal being generated by a DRAM controller (7) for refreshing data in DRAM (3) is increased. Then, when the external reset signal EXRST is disabled, a delayed reset signal DLYRST is generated and applied to the DRAM controller (7) so that it is reset. The CPU, being already reset, can then quickly reconfigure the DRAM controller and re-enable it to resume refreshing the DRAM (4), thus maintaining the data in the DRAM.

12 Claims, 2 Drawing Sheets

CIRCUIT AND METHOD FOR RETAINING DATA IN DRAM IN A PORTABLE ELECTRONIC DEVICE

FIELD OF THE INVENTION

This invention relates to portable electronic devices, such as Personal Digital Assistants (PDA) or Organisers which utilise Dynamic Random Access Memory (DRAM) to store the data and to a circuit and a method for retaining data in the DRAM of such a device.

BACKGROUND OF THE INVENTION

As is known, handheld portable electronic devices such as PDA's or electronic organisers typically operate on battery power and store data in an electronic memory. As will be apparent, a requirement of such devices is that data stored in the memory will not be lost when the device is powered down, as when the battery is being changed, or when the electronic circuits therein are otherwise reset, for example, deliberately by the user by pressing a reset button, or when the electronic circuitry itself senses a fault and needs to reset itself.

In the past, the most common way of preventing data being lost was by using Static Random Access Memory (SRAM). However, DRAM is presently cheaper than SRAM and, as prices of such portable electronic devices continue to fall, it is desirable to use the cheapest available memory. The problem with DRAM is that it requires periodic refresh signals to be input in order to maintain its data. If the refresh signal arrives too late, the voltages on the DRAM cell storing the data will have decayed and the data will be lost. On the other hand, during resetting of the device, the DRAM controller, which generates the refresh signals, would itself be reset and therefore unable to provide the required refresh signals to the DRAM.

To solve this problem, it has been known in the prior art for the controlling Central Processing Unit (CPU) to "reinterpret" the reset signal as an "interrupt" signal so that the CPU transfers all the data in the DRAM to a hard disc or Flash memory before resetting takes place. Thus, the reset signal is not a real reset and, furthermore, extra memory, either in the device or externally is required. Similarly, by using an external chip to help maintain the data in the DRAM while the main CPU is being reset involves external logic and communication between the CPU and that external logic, which is complicated and increases the costs.

Finally, although it would be possible to arrange for some of the logic circuitry within the device to be non-resettable, this is very dangerous to the operation of the device because after reset of the device, there is a chance of a deadlock occurring due to unpredictable values in the registers of the logic circuitry.

It is therefore an object of the present invention to provide a circuit and method which overcomes, or at least reduces, the disadvantage of the prior art.

BRIEF SUMMARY OF THE INVENTION

Accordingly, in one aspect, the invention provides circuit for retaining data in a Dynamic Random Access Memory (DRAM) during reset, the circuit comprising a reset controller having a reset input coupled to receive an external reset signal, a first output to provide an internal reset signal thereat in response to receipt of the external reset signal, and a second output to provide a delayed reset signal thereat in response to receipt of the external reset signal but delayed with respect to the internal reset signal; a Central Processing Unit (CPU) having an input coupled to the first output of the reset controller; and a DRAM controller having a first input coupled to the second output of the reset controller, a second input coupled to an output of the CPU, and an output couplable to the DRAM to provide a periodic refresh signal to the DRAM to prevent data stored therein being lost; wherein the delayed reset signal is generated only when the external reset signal has ended, such that the CPU is reset when the internal reset signal is received from the reset controller, but the DRAM controller continues to generate the refresh signal to refresh the DRAM until the delayed reset signal is received, whereupon the DRAM controller is reset and can then be reconfigured by the CPU to enable it to start to generate the refresh signal again.

In a preferred embodiment, the reset controller comprises a reset signal generating means for generating the internal reset signal in response to a beginning of the external reset signal being received and generating the delayed reset signal in response to an end of the external reset signal being received.

Preferably, the reset controller further comprises a control output coupled to a control input of the DRAM controller so as to increase the frequency of the refresh signal when the external reset signal is received. The refresh signal generating means preferably generates the periodic refresh signal at a second frequency, higher than, or at least equal to, the first frequency, when a control signal is received from the reset controller indicating that an external reset signal is received.

In one embodiment, the circuit preferably further comprises a port controller coupled between the DRAM controller and a port for coupling to the DRAM so as to select whether the port is enabled or not, wherein the port controller has an input coupled to the delayed output of the reset controller and the port controller disables the port and is reset in response to receipt of the delayed reset signal.

In a second aspect, the invention provides a method of maintaining data stored in Dynamic Random Access Memory (DRAM) of a portable electronic device during reset thereof, the method comprising the steps of generating refresh signals by a DRAM controller to maintain the data stored in the DRAM; generating an internal reset signal in response to receipt of an external reset signal; generating a delayed reset signal in response to receipt of the external reset signal, but delayed with respect to the internal reset signal; resetting at least a Central Processing Unit (CPU) of the portable electronic device in response to receipt by the CPU of the internal reset signal; resetting at least the DRAM controller of the portable electronic device in response to receipt by the DRAM controller of the delayed reset signal; such that the DRAM controller continues to generate the refresh signals to the DRAM while the CPU is being reset.

In a preferred embodiment, the method further comprises the step of increasing the frequency of the refresh signal generated by the DRAM controller when the external reset signal is received.

Preferably, the internal reset signal is generated in response to a beginning of the external reset signal being received and the delayed reset signal is generated in response to an end of the external reset signal being received.

The circuit is preferably incorporated in a portable electronic device having a Dynamic Random Access Memory (DRAM) wherein the output of the DRAM controller is coupled to the DRAM. The external reset signal can be generated by a user of the device. Alternatively, the external reset signal can be generated by other circuitry within the device.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
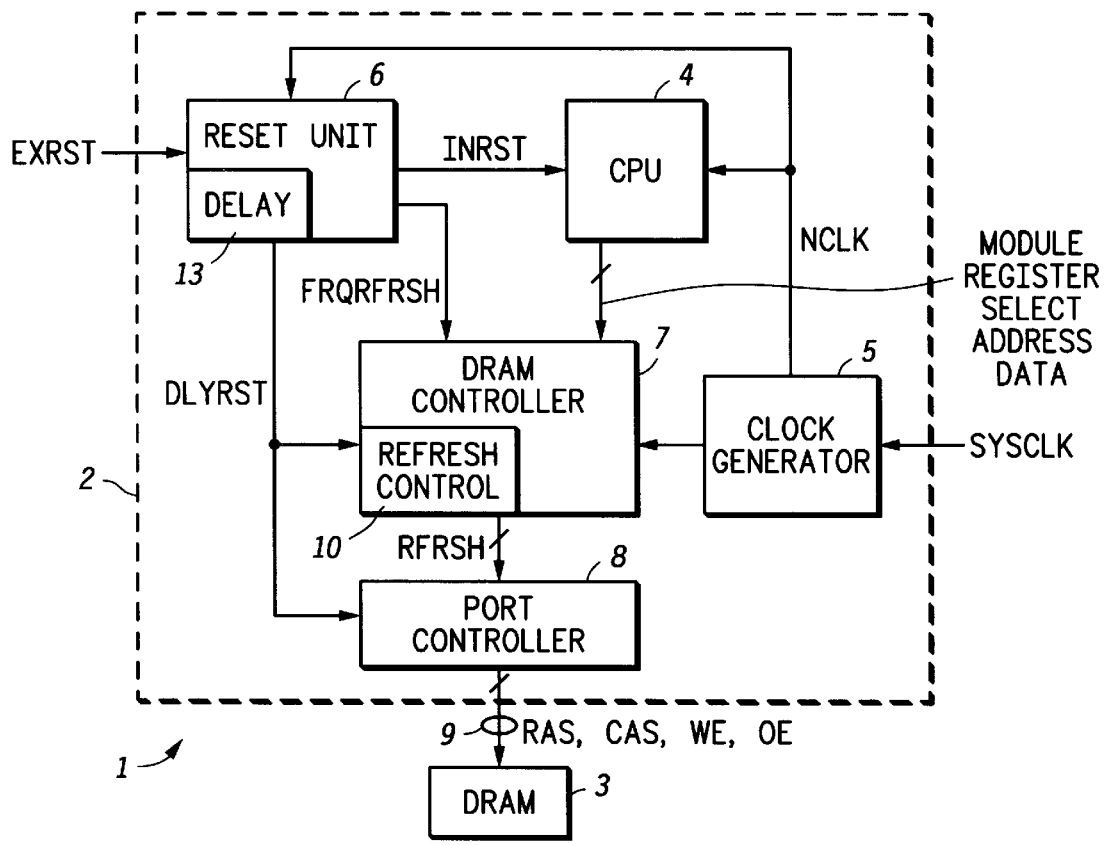
FIG. 1 shows a block diagram of a circuit incorporated in a portable electronic device having a Dynamic Random Access Memory (DRAM) for retaining data in the DRAM during reset.

As shown in FIG. 1, a portable electronic device 1 includes a processing circuit 2 and a Dynamic Random Access Memory (DRAM) 3 for storing data therein under the control of the processing circuit 2. The processing circuit 2 includes a Central Processor Unit (CPU) 4, a clock generator 5, which receives a system clock signal SYSCLK and generates appropriate clock signals therefrom, a reset unit 6, a DRAM controller 7 and a port controller 8, which controls whether a port 9 between the DRAM controller 7 and the DRAM 3 is enabled or disabled.

The reset unit 6 receives an external reset signal EXRST, which may be from a user generated control, such as a reset button on the device, or may be from other circuitry in the device, and synchronises the external reset signal EXRST with an internal clock signal INCLK, which is generated by the clock generator 5 from the system clock and may be at, for example, 32 kHz. As can best be seen in FIG. 2, since the external reset signal EXRST can start at any arbitrary time with respect to the internal clock INCLK, it is important that it be synchronised, for example at the next transition of the internal clock signal INCLK to produce an internal reset signal INRST. This internal reset signal INRST is therefore delayed slightly, as indicated by arrows 11, with respect to the external reset signal EXRST and is supplied to the CPU 4, as well as to other circuitry in the system that needs to be reset, but not, at this stage, to the DRAM controller 7 and the port controller 8.

The DRAM controller 7 includes a refresh control circuit 10 and other related circuitry and serves the function of generating necessary signals and timing for the DRAM 3 externally to perform read and write cycles for the CPU 4 and other peripherals, such as a Liquid Crystal Display (LCD) controller (not shown). The port controller serves the function of controlling the port 9 so as to connect the DRAM controller 7 to the external DRAM 3 or to multiplex signals from the DRAM controller with other functional signals. This generally only happens when not all of the DRAM signals are needed for the application, for example when only one bank of DRAM is used, and the pins of the other bank can then be utilised for other functions.

Figure 2:
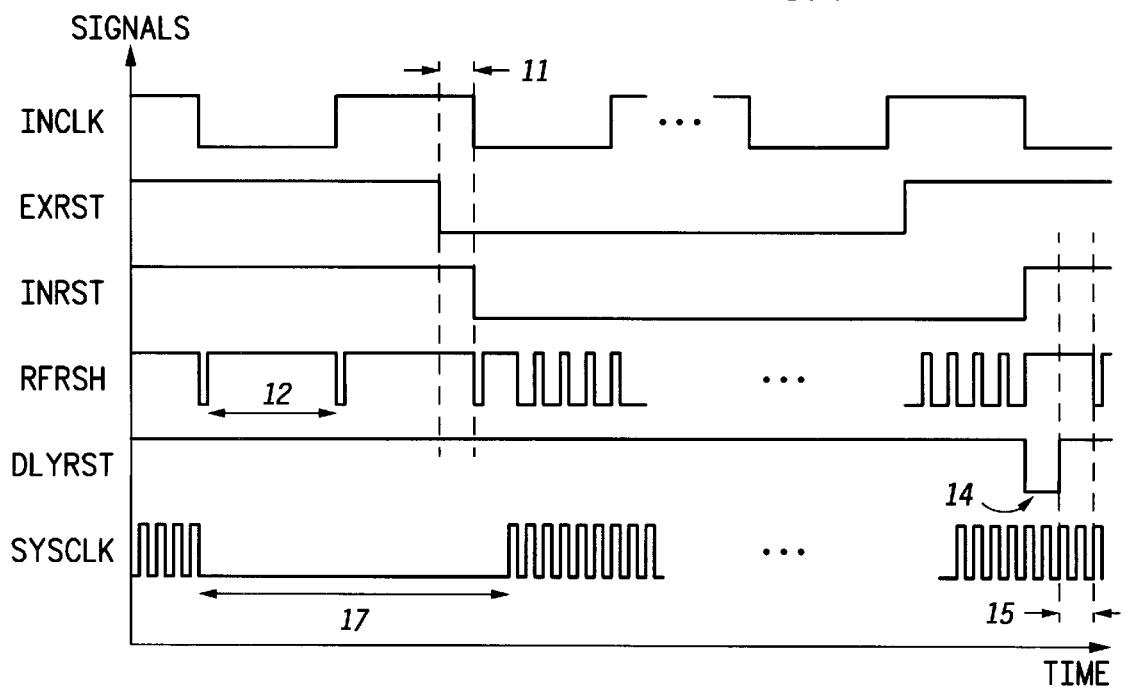
FIG. 2 shows a timing diagram of signals at various points in the circuit of FIG. 1.

Thus, as shown in FIG. 2, even after the internal reset signal INRST is generated, the DRAM refresh signal RFRSH is still generated by the DRAM controller 7 and is passed to the DRAM 3 to refresh it and maintain the data stored there. The refresh pulses may, for example, be generated at intervals of 15.6 µs as shown by arrow 12. During this time, the system clock SYSCLK may be off, or "asleep", as shown by arrow 17 in FIG. 2. However, in order to try to make sure that the DRAM 3 is refreshed just before the DRAM controller 7 and port controller 8 are reset, the frequency of the refresh signal RFRSH is increased after the internal reset signal INRST is generated. As best shown in FIG. 1, this occurs when the reset unit receives the external reset signal EXRST and generates a control signal FRQR-FRSH which is passed to the DRAM controller and indicates that the frequency of the refresh signal RFRSH should be increased, for example up to four or five times the normal frequency. This higher rate of refreshing the DRAM continues until shortly after the external reset signal EXRST ends. It will be appreciated that the length of the external reset signal will not be constant nor predictable since it will depend on how long a user keeps a button pressed. Accordingly, as shown in FIG. 2, the internal reset signal INRST will finish at the next transition of the internal clock signal INCLK.

At this time, the reset unit 6, which includes a delay element 13, generates a delayed reset signal DLYRST, which is passed to the DRAM controller 7 and to the port controller 8. This delayed reset signal DLYRST, shown at 14 in FIG. 2, causes the DRAM controller 7 to stop generating the refresh signal RFRSH and the port controller 8 to disable the port 9 and to reset both controllers. The CPU 4 can then program the DRAM controller 7 and the port controller 8 using appropriate address, data and select signals and register values to reconfigure the functions of the controllers, as required. This reconfiguration takes only a relatively short time, as shown by arrows 15 in FIG. 2, before the CPU 4 can once again enable the port controller 8 and the DRAM controller 7 so that the DRAM controller 7 can generate refresh signals to refresh the DRAM 3, as shown by arrow 16 in FIG. 2.

It will thus be seen in FIG. 2 that the period of time between the last refresh of the DRAM before the DRAM controller is reset and the first refresh pulse after it is reconfigured and enabled again is approximately the length of the delay reset signal DLYRST from the reset unit 6 plus the length of time needed for the CPU to reconfigure and enable the DRAM controller. This period is relatively short, possibly shorter than the interval 12 between "normal" refresh pulses, so that the data in the DRAM is maintained. It will be apparent that if the refresh rate is not increased during the period that the internal reset signal INRST is on, then, depending on when the external reset signal comes to an end, the period between the last refresh pulse before reset and the first refresh pulse after enablement may be almost as long as two "normal" intervals 12. Depending on the refresh rate required by the DRAM to maintain data and the "normal" interval 12, this may be sufficient, but increasing the frequency of the refresh rate during the period that the internal rest signal INRST is on will improve the chances that data will be maintained by relaxing the requirement of interval 15.

Figure 3:
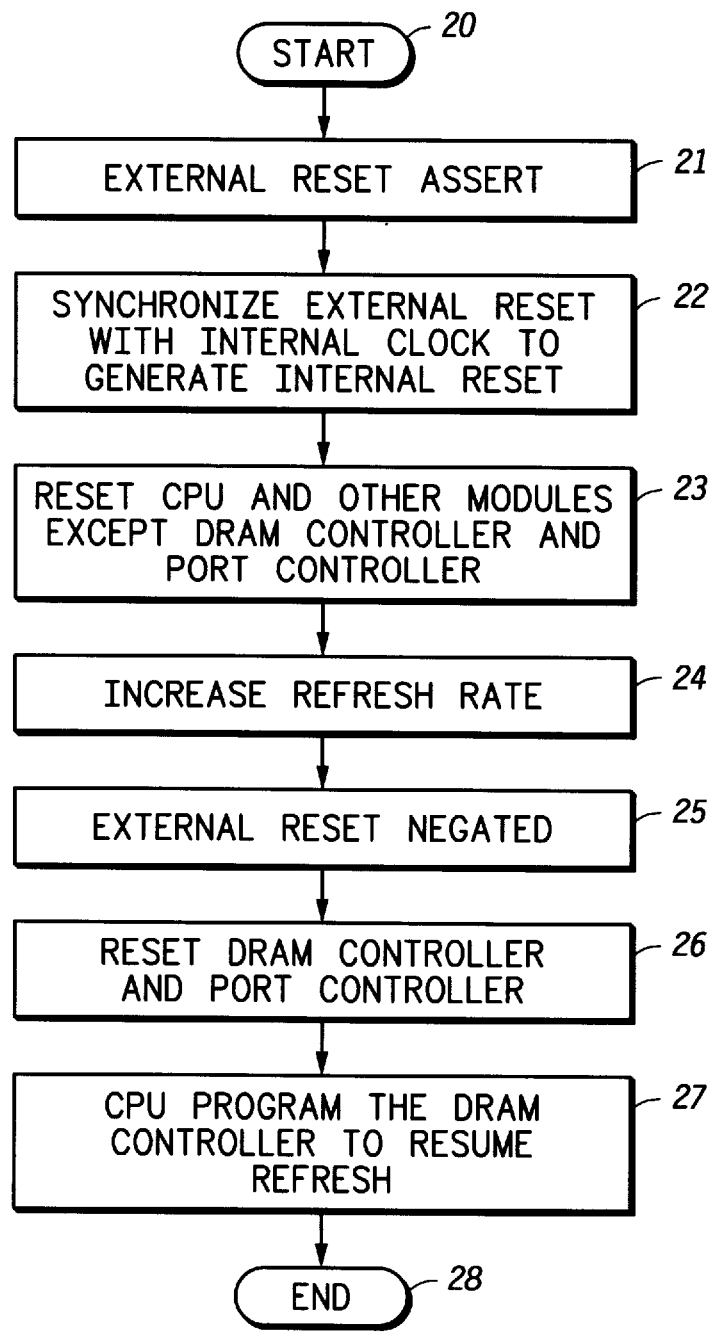
FIG. 3 shows a flow diagram of the method used in operation of the circuit of FIG. 1.

FIG. 3 shows a flowchart of the operation of the above described embodiment for retaining data in a DRAM before, during and after an external reset is asserted. The initial state assumes that, whether the system clock is sleeping or fully running, the DRAM is being refreshed by the DRAM controller.

Thus, from the start 20, an external reset signal is asserted 21 and this external reset signal is synchronised 22 with an internal clock to produce an internal reset signal. The internal reset signal is applied to the CPU and other modules in the circuit to reset them 23, but this internal reset signal is not applied to the DRAM controller, nor to the port controller. Instead, while the internal reset signal is being applied to the CPU and the other modules, the rate of the refresh signal being generated by the DRAM controller for refreshing the data in the DRAM is increased 24. Then, when the external reset signal is disabled 25, followed by the internal reset signal, a delayed reset signal is generated and applied to the DRAM controller and the port controller so that they are reset 26. The CPU, being already reset, can then quickly reconfigure the DRAM and port controllers and re-enable them 27 to resume refreshing the DRAM, thus ending 28 the sequence.

It will be appreciated that although only one particular embodiment of the invention has been described in detail, various modifications and improvements can be made by a person skilled in the art without departing from the scope of the present invention.

We claim:

1. A circuit for retaining data in a Dynamic Random Access Memory (DRAM) during reset, the circuit comprising:

a reset controller having:
  a reset input coupled to receive an external reset signal,
  a first output to provide an internal reset signal thereat in response to receipt of the external reset signal, and
  a second output to provide a delayed reset signal thereat in response to receipt of the external reset signal but delayed with respect to the internal reset signal;

a Central Processing Unit (CPU) having:
  an input coupled to the first output of the reset controller;

a DRAM controller having:
  a first input coupled to the second output of the reset controller,
  a second input coupled to an output of the CPU, and
  an output couplable to the DRAM to provide a periodic refresh signal to the DRAM to prevent data stored therein being lost;

wherein the delayed reset signal is generated only when the external reset signal has ended, such that the CPU is reset when the internal reset signal is received from the reset controller, but the DRAM controller continues to generate the refresh signal to refresh the DRAM until the delayed reset signal is received, whereupon the DRAM controller is reset and can then be reconfigured by the CPU to enable it to start to generate the refresh signal again.

2. A circuit according to claim 1, wherein the reset controller comprises a reset signal generating means for generating the internal reset signal in response to a beginning of the external reset signal being received and generating the delayed reset signal in response to an end of the external reset signal being received.

3. A circuit according to claim 1, wherein the reset controller further comprises a control output coupled to a control input of the DRAM controller so as to increase the frequency of the refresh signal when the external reset signal is received.

4. A circuit according to claim 1, wherein the DRAM controller comprises a refresh signal generating means for generating the periodic refresh signal at a first frequency necessary to refresh the DRAM so that data stored therein is not lost.

5. A circuit according to claim 4, wherein the refresh signal generating means generates the periodic refresh signal at a second frequency, higher than the first frequency, when a control signal is received from the reset controller indicating that an external reset signal is received.

6. A circuit according to claim 1, further comprising a port controller coupled between the DRAM controller and a port for coupling to the DRAM so as to select whether the port is enabled or not, wherein the port controller has an input coupled to the delayed output of the reset controller and the port controller disables the port and is reset in response to receipt of the delayed reset signal.

7. A portable electronic device comprising Dynamic Random Access Memory (DRAM) for storing data and a circuit according to any preceding claim in which the DRAM controller output is coupled to the DRAM.

8. A method of maintaining data stored in Dynamic Random Access Memory (DRAM) of a portable electronic device during reset thereof, the method comprising the steps of:

generating refresh signals by a DRAM controller to maintain the data stored in the DRAM;

generating an internal reset signal in response to receipt of an external reset signal;

generating a delayed reset signal in response to receipt of the external reset signal, but delayed with respect to the internal reset signal;

resetting at least a Central Processing Unit (CPU) of the portable electronic device in response to receipt by the CPU of the internal reset signal;

resetting at least the DRAM controller of the portable electronic device in response to receipt by the DRAM controller of the delayed reset signal;

such that the DRAM controller continues to generate the refresh signals to the DRAM while the CPU is being reset.

9. A method of maintaining data stored in DRAM according to claim 8, further comprising the step of:

increasing the frequency of the refresh signal generated by the DRAM controller when the external reset signal is received.

10. A method of maintaining data stored in DRAM according to claim 8, wherein the internal reset signal is generated in response to a beginning of the external reset signal being received and the delayed reset signal is generated in response to an end of the external reset signal being received.

11. A method of maintaining data stored in DRAM according to claim 8, wherein the external reset signal is generated by a user of the device.

12. A method of maintaining data stored in DRAM according to claim 8, wherein the external reset signal is generated by other circuitry within the device.

* * * * *